US008895347B2

(12) United States Patent
Wang et al.

(10) Patent No.: US 8,895,347 B2
(45) Date of Patent: Nov. 25, 2014

(54) METHOD FOR FABRICATING SEMICONDUCTOR LAYER HAVING TEXTURED SURFACE AND METHOD FOR FABRICATING SOLAR CELL

(71) Applicant: Industrial Technology Research Institute, Chutung, Hsinchu (TW)

(72) Inventors: Teng-Yu Wang, Taipei (TW); Chien-Hsun Chen, Tainan (TW); Chen-Hsun Du, Taipei (TW); Chung-Yuan Kung, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 2 days.

(21) Appl. No.: 13/869,764

(22) Filed: Apr. 24, 2013

(65) Prior Publication Data

US 2013/0237005 A1    Sep. 12, 2013

Related U.S. Application Data

(63) Continuation-in-part of application No. 13/607,763, filed on Sep. 9, 2012, now Pat. No. 8,609,456.

(30) Foreign Application Priority Data

Feb. 16, 2012    (TW) .............................. 101105045 A
Jan. 11, 2013    (TW) .............................. 102101040 A

(51) Int. Cl.
| H01L 21/00 | (2006.01) |
| H01L 21/30 | (2006.01) |
| H01L 31/18 | (2006.01) |
| H01L 21/20 | (2006.01) |
| H01L 31/0236 | (2006.01) |
| H01L 31/068 | (2012.01) |

(52) U.S. Cl.
CPC ............... *H01L 31/18* (2013.01); *H01L 21/20* (2013.01); *H01L 31/02363* (2013.01); *H01L 31/068* (2013.01); *Y02E 10/52* (2013.01); *Y02E 10/547* (2013.01)
USPC ............................................ 438/71; 438/458

(58) Field of Classification Search
None
See application file for complete search history.

(56) References Cited

U.S. PATENT DOCUMENTS

| 6,372,609 B1 | 4/2002 | Aga et al. |
| 7,025,665 B2 | 4/2006 | Bender |

(Continued)

FOREIGN PATENT DOCUMENTS

| JP | 05-218464 | 8/1993 |
| JP | 07-226528 | 8/1995 |

(Continued)

OTHER PUBLICATIONS

Valerie Depauw, et al., "Innovative lift-off solar cell made of monocrystalline-silicon thin film by annealing of ordered macropores", Phys Status Solidi C, Mar. 17, 2009, pp. 1750-1753, vol. 6 No. 7.

(Continued)

*Primary Examiner* — Scott B Geyer
(74) *Attorney, Agent, or Firm* — Muncy, Geissler, Olds & Lowe, P.C.

(57) ABSTRACT

The disclosure provides a method for fabricating a semiconductor layer having a textured surface, including: (a) providing a textured substrate; (b) forming at least one semiconductor layer on the textured substrate; (c) forming a metal layer on the semiconductor layer; and (d) conducting a thermal process or a low temperature process to the textured substrate, the semiconductor layer and the metal layer, wherein the semiconductor layer is separated from the textured substrate by the thermal process to obtain the semiconductor layer having the metal layer and a textured surface.

17 Claims, 8 Drawing Sheets

(56) References Cited

U.S. PATENT DOCUMENTS

| | | |
|---|---|---|
| 7,077,901 B2 | 7/2006 | Nakagawa et al. |
| 7,557,367 B2 | 7/2009 | Rogers et al. |
| 7,622,367 B1 | 11/2009 | Nuzzo et al. |
| 7,749,795 B2 | 7/2010 | Tanaka |
| 7,875,531 B2 | 1/2011 | Dross et al. |
| 7,982,296 B2 | 7/2011 | Nuzzo et al. |
| 8,012,851 B2 | 9/2011 | Henley et al. |
| 8,609,456 B2 * | 12/2013 | Wang et al. ............... 438/71 |
| 2003/0183159 A1 | 10/2003 | Nakagawa et al. |
| 2006/0038182 A1 | 2/2006 | Rogers et al. |
| 2009/0294803 A1 | 12/2009 | Nuzzo et al. |
| 2010/0072577 A1 | 3/2010 | Nuzzo et al. |
| 2010/0108130 A1 | 5/2010 | Ravi |
| 2010/0108134 A1 | 5/2010 | Ravi |
| 2010/0323472 A1 | 12/2010 | Dross et al. |
| 2011/0220890 A1 | 9/2011 | Nuzzo et al. |
| 2011/0277813 A1 | 11/2011 | Rogers et al. |

FOREIGN PATENT DOCUMENTS

| | | |
|---|---|---|
| JP | 10-084126 | 3/1998 |
| JP | 10-084127 | 3/1998 |
| JP | 10-093122 | 4/1998 |
| JP | 11-214-720 | 8/1999 |
| JP | 2001-007362 | 1/2001 |
| TW | I284423 | 7/2007 |
| TW | 200937645 | 9/2009 |
| WO | WO 2010-062341 | 6/2010 |
| WO | WO 2010-062343 | 6/2010 |
| WO | WO 2011-031707 | 3/2011 |
| WO | WO 2011-133975 | 10/2011 |

OTHER PUBLICATIONS

V. Depauw, et al., "Proof of concept of an epitaxy-free layer-transfer process for silicon solar cells based on the reorganisation of macropores upon annealing", Materials Science and Engineering B, 2009, pp. 286-290, vol. 159-160.

Jan Vaes, et al., "SLiM-Cut thin silicon wafering with enhanced crack and stress control", Proceedings of SPIE—The International Society for Optical Engineering, 2010, 777212-1-777212-11, vol. 7772.

Jiangang Du, et al., "Single Crystal Silicon MEMS Fabrication Technology Using Proton-Implantation Smart-Cut Technique", Sensors Proceedings of IEEE, 2002, pp. 585-588, vol. 1.

I Gordon, et al., "Three novel ways of making thin-film crystalline-silicon layers on glass for solar cell applications", Solar Energy Materials & Solar Cells, Dec. 30, 2010, pp. S2-S7, vol. 95.

F Henley, et al., "Direct film transfer (DFT) technology for kerf-free silicon wafering", 23$^{rd}$ European Photovoltaic Solar Energy Conference, Sep. 1-5, 2008, pp. 1090-0193, Valencia, Spain.

Achim Eyer, et al., "Crystalline silicon thin-film (CSiTF) solar cells on SSP and on ceramic substrates", Journal of Crystal Growth, 2001, pp. 340-347, vol. 225.

Teng-Yu Wang, et al., "Fabrication of an Ultra-Then Silicon Wafer with Honeycomb Structure by Thermal-Stress Induced Pattern Transfer (TIPT) Method", Jun. 3-8, 2012, 4 pages, 38$^{th}$ IEEE Photovoltaic Specialists Conference, Austin, Texas.

Wang, et al., "Fabrication of an ultrathin silicon wafer with a honeycomb structure by the thermal-stress-induced pattern transfer (TIPT) method", Journal of Micromechanics and Microengineering, 22, 2012, pp. 1-5.

* cited by examiner

US 8,895,347 B2

METHOD FOR FABRICATING SEMICONDUCTOR LAYER HAVING TEXTURED SURFACE AND METHOD FOR FABRICATING SOLAR CELL

CROSS REFERENCE TO RELATED APPLICATIONS

This application is a Continuation-In-Part of pending U.S. patent application Ser. No. 13/607,763, filed Sep. 9, 2012, which claims priority from Taiwan Patent Application Serial No. 101105045, filed on Feb. 16, 2012, the entirety of which is incorporated by reference herein.

This Application claims priority from Taiwan Patent Application Serial No. 102101040, filed on Jan. 11, 2013, the entirety of which is incorporated by reference herein,

TECHNICAL FIELD

The present disclosure relates to a method for fabricating a semiconductor layer having a textured surface and method for fabricating a solar cell.

BACKGROUND

Currently, a thin wafer is formed by cutting the wafer. However, thin wafers are easily broken during the cutting process. The thin wafer is then assembled into the cell, and it is a challenge to avoid the thin wafer from becoming damaged during the assembly process.

Additionally, because the surfaces of the thin wafer are smooth, the thin wafer having a textured surface is formed by dry etching process, not by wet etching process. Therefore, there is a need to develop a thin wafer having a textured surface for usage in solar cell.

SUMMARY

The disclosure provides a method for fabricating a semiconductor layer having a textured surface, comprising: (a) providing a textured substrate; (b) forming at least one semiconductor layer on the textured substrate; (c) forming a metal layer on the semiconductor layer; and (d) conducting a thermal process or a low temperature process to the textured substrate, the semiconductor layer and the metal layer, wherein the semiconductor layer is separated from the textured substrate by the thermal process to obtain the semiconductor layer having the metal layer and a textured surface.

The disclosure also provides a method for fabricating a solar cell, comprising: (a-2) providing a textured substrate; (b-2) forming at least one silicon layer on the textured substrate; (c-2) forming a metal layer on the silicon layer; (d-2) conducting a thermal process or a low temperature process to the textured substrate, the semiconductor layer and the metal layer, wherein the silicon layer is separated from the textured substrate by the thermal process to obtain the silicon layer having the metal layer and a textured surface; (e-2) forming an anti-reflection layer on the silicon layer having a textured surface; and (f-2) forming an electrode layer on the anti-reflection layer.

A detailed description is given in the following embodiments with reference to the accompanying drawings.

BRIEF DESCRIPTION OF THE DRAWING

For a more complete understanding of the present disclosure, and the advantages thereof, reference is now made to the following descriptions taken in conjunction with the accompanying drawings, in which.

DETAILED DESCRIPTION

The following description is of the embodiments of carrying out the disclosure. This description is made for the purpose of illustrating the general principles of the disclosure and should not be taken in a limiting sense. The scope of the disclosure is best determined by reference to the appended claims.

Referring to FIG. 1A-1E, the disclosure provides a method for fabricating a semiconductor layer having a textured surface. The method comprises steps (a)-(d).

Figure 1A:
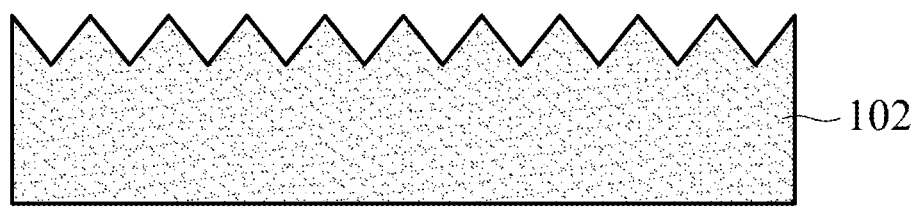
FIGS. 1A-1E show a series of cross-sectional schematic representations of a method for fabricating the semiconductor layer having a textured surface in accordance with an embodiment of the disclosure.

Firstly, referring to FIG. 1A, a textured substrate 102 is provided. The substrate 102 comprises heat resistance materials. The substrate 102 comprises sapphire, quartz, silicon carbide (SiC), silicon wafer, single crystalline silicon or oxide crystalline. The patterns of the textured substrate 102 may be regular or irregular patterns, such as pyramid, inverted pyramid or porous etc. . . . .

In one embodiment, the sapphire is used as the textured substrate 102, and a textured sapphire substrate is obtained by a patterned process (lithography process).

Figure 1B:
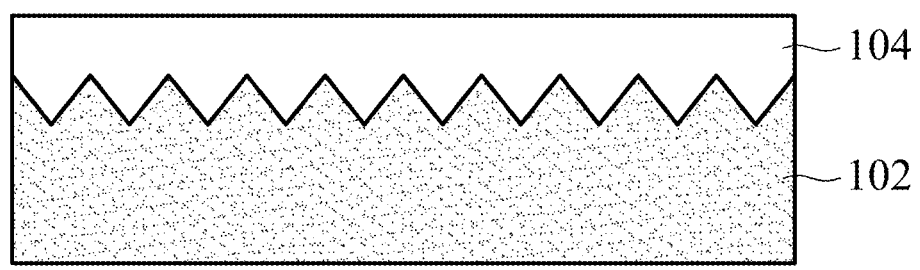

Referring to FIG. 1B, the method continues in step (b), wherein at least one semiconductor layer 104 is formed on the textured substrate 102. The semiconductor layer 104 comprises silicon (Si), germanium (Ge), silicon germanium (SiGe), gallium nitride (GaN), gallium arsenide (GaAs), gallium phosphide (GaP), indium nitride (InN), indium phosphide (InP) or combinations thereof. The silicon comprises multi-crystalline silicon, single crystalline silicon or micro-crystalline silicon.

Note that the semiconductor layer 104 may be a single layer or multi-layers which may be adjusted by those skilled in the art according to the actual application.

The semiconductor layer 104 is formed by a chemical vapor deposition method (CVD), physical vapor deposition method (PVD) or molecular beam epitaxy (MBE).

Additionally, before step (c), the method further comprises performing a doping step to the semiconductor layer 104.

In one embodiment, a P-type silicon is formed by doping with a P-type dopant. The P-type dopant comprises boron (B), aluminum (Al), geranium (Ge) indium (In), etc. . . .

In another embodiment, an N-type silicon is formed by doping with an N-type dopant. The N-type dopant comprises phosphorus (P), arsenic (As), antimony (Sb), etc. . . .

Figure 1C:
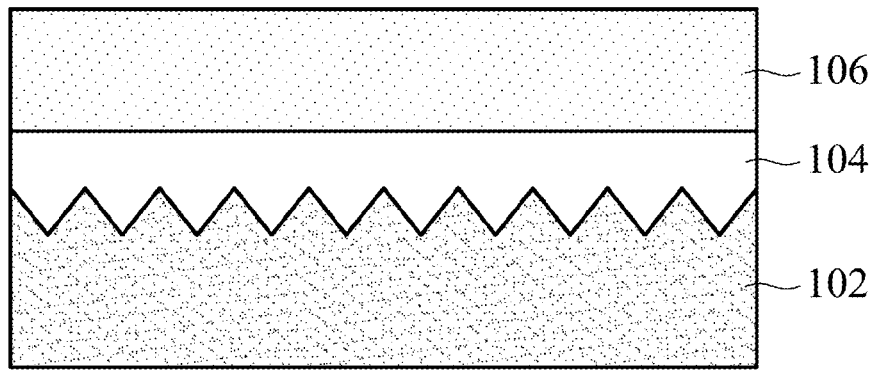

Referring to FIG. 1C, the method continues in step (c), wherein a metal layer 106 is formed on the semiconductor layer 104. The metal layer 106 comprises gold, aluminum, silver or combinations thereof.

The metal layer 106 is formed by a coating method, printing method, electroplating method or physical vapor deposition method (PVD).

Figure 1D:
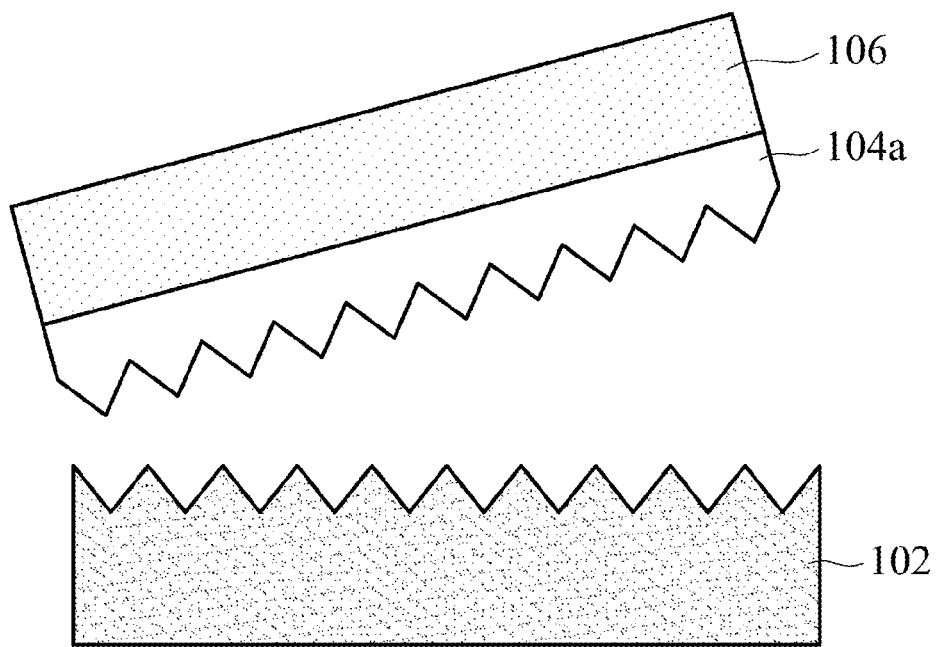

Referring to FIG. 1D, the method continues in step (d), wherein a thermal process is conducted on the textured substrate 102, the semiconductor layer 104 and the metal layer 106, wherein the semiconductor layer 104 is separated from the textured substrate 102 by the thermal process or a low temperature process to obtain the semiconductor layer 104a having the metal layer 106 and a textured surface.

The thermal process in an embodiment is conducted at a temperature of about 200-1000° C., and in another embodiment about 250-550° C. The thermal process in an embodiment is conducted for about 10-60 minutes, and in another embodiment about 15-30 minutes.

The low temperature process in an embodiment is conducted at a temperature of about −250° C.−−20° C., and in another embodiment about −200° C.−−150° C. The thermal process in an embodiment is conducted for about 1-10 minutes, and in another embodiment about 1-3 minutes.

Figure 1E:
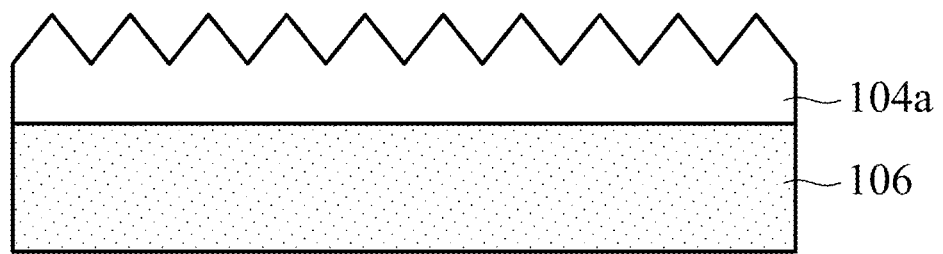

Referring to FIG. 1E, the method continues in step (e), wherein the semiconductor layer 104a having a textured surface is formed on the metal layer 106, in one embodiment, the semiconductor layer 104a having textured surface has a thickness of about 1-100 μm, and in another embodiment the semiconductor layer 104a having textured surface has a thickness of about 2-50 μm.

Note that the metal layer 106 and the semiconductor layer 104 are bonded tightly by the thermal process. A deformation stress is produced in the metal layer 106 due to the difference of thermal expansion coefficients between the metal layer 106 and the textured substrate 102. Thus, the semiconductor layer 104 is separated from the textured substrate 102 by the thermal process and the semiconductor layer 104a having a thin and textured surface is obtained.

Furthermore, referring to FIG. 2A-2G, the disclosure provides a method for fabricating a solar cell. The method comprises step (a-2)-(f-2).

Firstly, a textured substrate 202 is provided. The material of the textured substrate 202 is the same as that of the textured substrate 102, and thus is omitted.

Figure 2A:
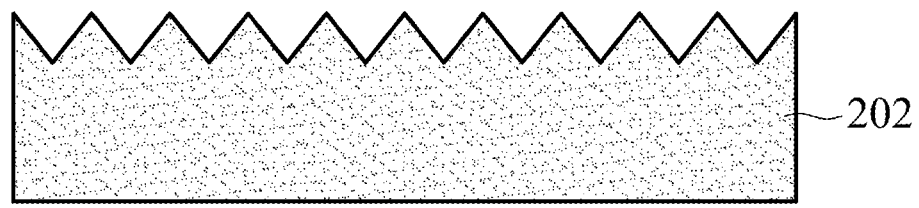
FIGS. 2A-2G show a series of cross-sectional schematic representations of a method for fabricating a solar cell in accordance with an embodiment of the disclosure.
Figure 2B:
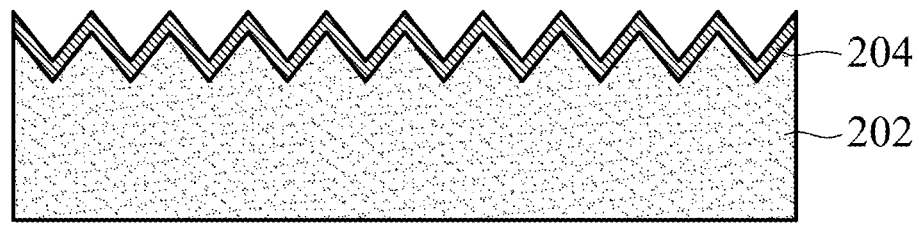

Referring to FIG. 2B, the method continues in step (b-2), wherein at least one first silicon layer 204 is formed on the textured substrate 202. The silicon layer 204 comprises multi-crystalline silicon, single crystalline silicon or micro-crystalline silicon.

Additionally, in step (b-2), at least one silicon germanium alloy layer is formed on the silicon layer.

In one embodiment, a single first silicon layer 204 may be formed, and the first silicon layer 204 may be a doped silicon layer, such as a P-type or N-type silicon layer. The P-type silicon layer is formed by doping boron (B), aluminum (Al), geranium (Ge), indium (In), etc. . . . The N-type silicon layer is formed by doping phosphorus (P), arsenic (As), antimony (Sb), etc. . . . .

Figure 2C:
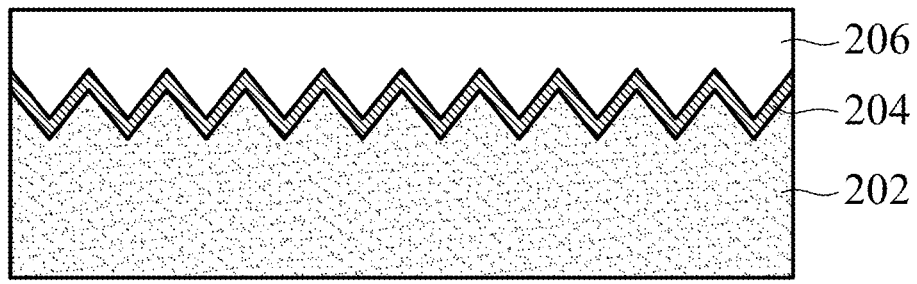

Referring to FIG. 2C (optional), a second silicon layer may be formed. The second silicon layer 206 of a different doped type is formed on the first silicon layer 204. For example, a P-type first silicon layer 204 is firstly formed, and then a second, N-type silicon layer 206 is formed on the P-type first silicon layer 204.

Note that although FIG. 2B-2C shows two silicon layers, multi-layers may also be formed by those skilled in the art according to the actual application.

Figure 2D:
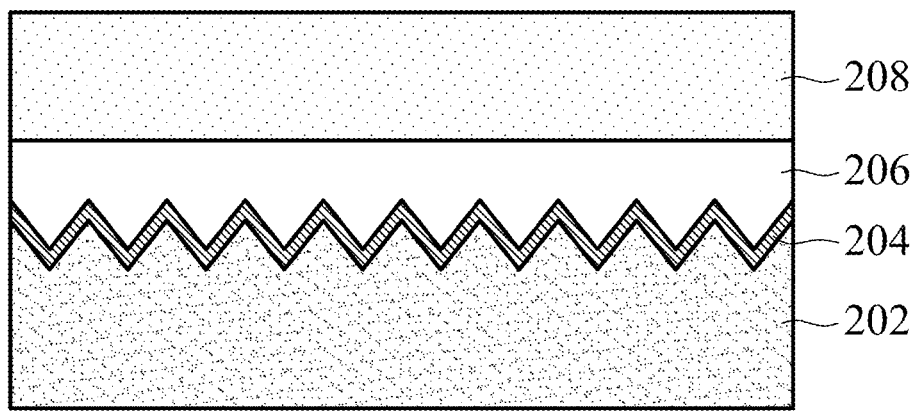

Referring to FIG. 2D, the method continues in step (c-2), wherein a metal layer 208 is formed on the first silicon layer 204 and the second silicon layer 206. If the second silicon layer 206 is not formed (FIG. 2C is not performed), the metal layer 208 is only formed on the first silicon layer 204. The material and fabrication method of the metal layer 208 are described above, and thus are omitted.

Figure 2E:
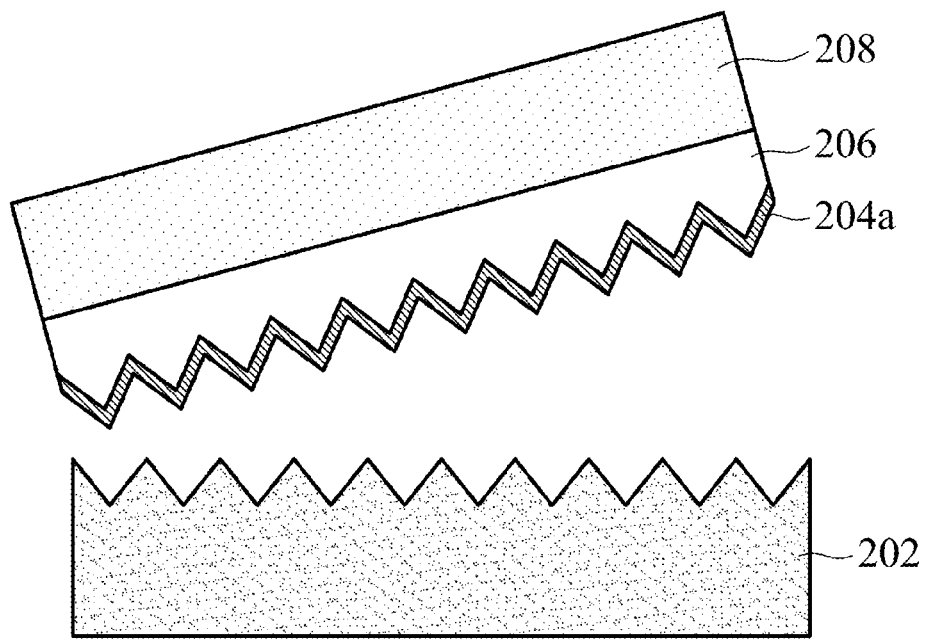

Referring to FIG. 2E, the method continues in step (d-2), wherein a thermal process or a low temperature process is conducted on the textured substrate 202, the first silicon layer 204 and second silicon layer 206, and the metal layer 208, wherein the first silicon layer 204 and the second silicon layer 206 is separated from the textured substrate 202 by the thermal process to obtain a first silicon layer 204a having the metal layer 208 and a textured surface.

The thermal process is conducted at a temperature of about 200-1000° C., and in another embodiment the thermal process is conducted at a temperature of about 250-600° C. The thermal process in an embodiment is conducted for about 10-60 minutes, and in another embodiment, the thermal process is conducted for about 15-30 minutes.

The low temperature process in an embodiment is conducted at a temperature of about −250° C.−−20° C., and in another embodiment about −200° C.−−150° C. The thermal process in an embodiment is conducted for about 1-10 minutes, and in another embodiment about 1-3 minutes.

Figure 2F:
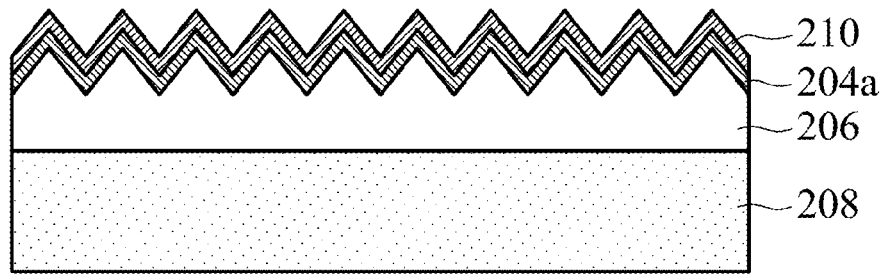

Then, referring FIG. 2F, the method continues in step (e-2), wherein an anti-reflection layer (ARC) 210 is formed on the first silicon layer 204a having a textured surface. The anti-reflection layer (ARC) 210 is a dielectric material which comprises silicon nitride (SiN), silicon dioxide ($SiO_2$), titanium dioxide ($TiO_2$) or tantalum oxide ($Ta_2O_5$). The anti-reflection layer (ARC) 210 is formed by plasma enhanced chemical vapor deposition, (PECVD), low pressure chemical vapor deposition (LPCVD), ink jet printing or coating method.

Figure 2G:
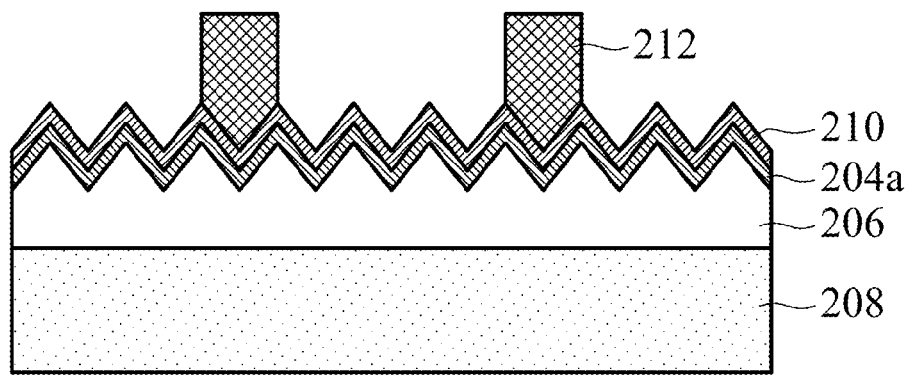

Referring to FIG. 2G, the method continues in step (f-2), wherein an electrode layer 212 is formed on the anti-reflection layer (ARC) 210. The electrode layer 212 comprises aluminum, silver or combinations thereof. Thus, a thin solar cell 20 having a thickness of about 1-100 μm and in another embodiment having a thickness of about 2-50 μm is obtained. The electrode layer 212 is formed by a coating method, printing method, electroplating method or physical vapor deposition method (PVD).

In addition to being used in the solar-cell field, the method for fabricating a semiconductor layer having a textured surface of the disclosure may be used in other semiconductor fabrication processes.

EXAMPLE

Example 1

Figure 3:
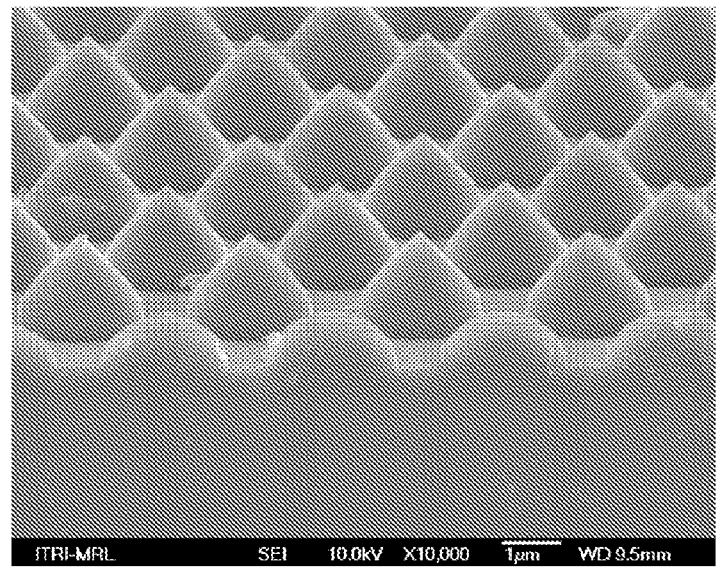
FIG. 3 shows a scanning electron microscopy (SEM) image of the textured substrate in accordance with an embodiment of the disclosure.

Firstly, a textured sapphire substrate was provided. FIG. 3 shows a scanning electron microscopy (SEM) image of the textured substrate. As shown in FIG. 3, the textured sapphire substrate had regular patterns.

Then, a 3 μm of micro-crystalline silicon layer was formed on the textured sapphire substrate by plasma enhanced chemical vapor deposition (PECVD) (experimental conditions: gas: silane ($SiH_4$); temperature: about 200° C.; pressure: 0.5 torr; RF power: 200 W).

Figure 4:
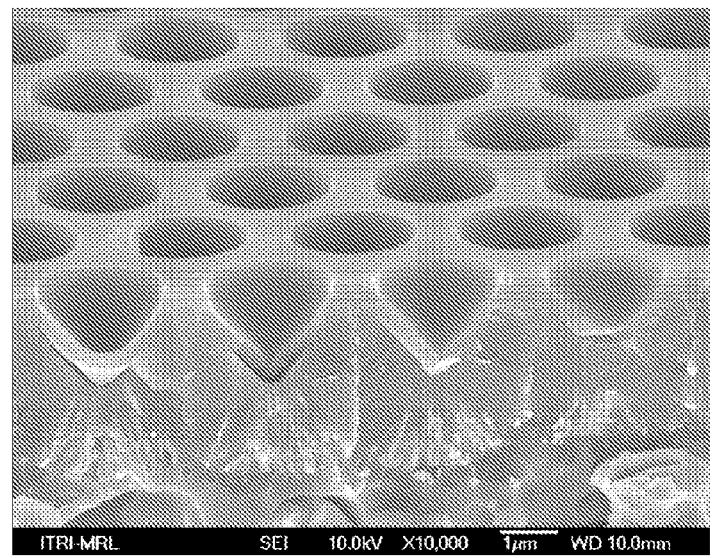
FIG. 4 shows a scanning electron microscopy (SEM) image of the semiconductor layer having a textured surface in accordance with an embodiment of the disclosure.

Then, a conductive silver glue (Dupont PV-159) was coated on the micro-crystalline silicon layer. Next, the textured sapphire substrate was put in an oven about at 600° C. for 30 minutes, and the micro-crystalline silicon layer was separated from the textured substrate by the thermal process. Thus, the conductive silver glue having a textured micro-crystalline silicon layer having a thickness of about 1-100 μm, and in another embodiment having a thickness of about 2-50

μm. FIG. 4 shows a scanning electron microscopy (SEM) image of the micro-crystalline silicon layer having a textured surface.

Example 2

The experimental condition of Example 2 was the same as that of Example 1, except that a different type of conductive silver glue (Dupont PV-412) was coated on the micro-crystalline silicon layer. Then, the textured sapphire substrate was put in an oven at 250° C. for 10 minutes, and the micro-crystalline silicon layer was separated from the textured sapphire substrate by the thermal process. Thus, the conductive silver glue has a textured micro-crystalline silicon layer having a thickness of about 1-100 μm, and in another embodiment having a thickness of about 2-50 μm.

Example 3

The experimental condition of Example 3 was the same as that of Example 1, except that a different type of thermal setting and low temperature cured silver glue was coated on the micro-crystalline silicon layer. Then, after the silver glue was dried and the silver glue was tightly adhered to the micro-crystalline silicon layer, the textured sapphire substrate was put in liquid nitrogen. Thus, the conductive silver glue has a textured micro-crystalline silicon layer.

Example 4

Fabricating the Solar Cell

A silicon nitride anti-reflection layer was coated on the textured micro-crystalline silicon layer of Example 1. Then, a silver layer was formed on the silicon nitride anti-reflection layer by an electroplating method. Thus, a solar cell was obtained. The conductive silver glue was used as a back contact, and the silver layer was used as a front contact.

Example 5

A 3 μm micro-crystalline silicon layer was formed on the textured sapphire substrate by plasma enhanced chemical vapor deposition (PECVD) (the experimental conditions was the same as Example 1).

A 150 nm $Ge_{0.1}Si_{0.9}$ alloy layer was formed on the micro-crystalline silicon layer. (Experimental conditions: gas: germane ($GeH_4$); temperature: about 250° C.; pressure: 3 torr; RF power: 50 W.)

Then, a conductive silver glue (Dupont PV-412) was coated on the $Ge_{0.1}Si_{0.9}$ alloy layer. Next, the textured sapphire substrate was put in an oven about at 250° C. for 10 minutes, and the two-layered semiconductor layer (the first layer is a micro-crystalline silicon layer and the second layer is a $Ge_{0.1}Si_{0.9}$ alloy layer) was separated from the textured sapphire substrate by the thermal process. Thus, the conductive silver glue having a textured semiconductor layer.

Example 6

The experimental condition of Example 6 was the same as that of Example 1, except that the germanium (Ge) multi-crystalline silicon was formed by a solution growth method. A 100 μm germanium multi-crystalline silicon layer was formed on the sapphire substrate about at a temperature of 950° C. and a pressure of 760 torr.

Then, a conductive silver glue (Dupont PV-159) was coated on the germanium multi-crystalline silicon layer. Next, the textured sapphire substrate was put in an oven about at 550° C. for 30 minutes, and the germanium multi-crystalline silicon layer was separated from the textured sapphire substrate by the thermal process. Thus, the conductive silver glue having a textured silicon layer.

Example 7

The experimental condition of Example 7 was the same as that of Example 1, except that a single crystalline silicon layer was used as the substrate.

Example 8

The experimental condition of Example 8 was the same as that of Example 2, except that a single crystalline silicon layer was used as the substrate.

Example 9

The experimental condition of Example 9 was the same as that of Example 3, except that a single crystalline silicon layer was used as the substrate.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor layer having a textured surface, comprising:
    (a) providing a textured substrate;
    (b) forming at least one semiconductor layer on the textured substrate;
    (c) forming a metal layer on the semiconductor layer; and
    (d) conducting a low temperature process to the textured substrate, the semiconductor layer and the metal layer, wherein the semiconductor layer is separated from the textured substrate by the low temperature process to obtain the semiconductor layer having the metal layer and a textured surface.

2. The method for fabricating a semiconductor layer having a textured surface as claimed in claim 1, wherein the substrate comprises sapphire, quartz, silicon carbide (SiC), silicon wafer, single crystalline silicon or oxide crystalline.

3. The method for fabricating a semiconductor layer having a textured surface as claimed in claim 1, wherein the semiconductor layer comprises silicon (Si), germanium (Ge), silicon germanium (SiGe), gallium nitride (GaN), gallium arsenide (GaAs), gallium phosphide (GaP), indium nitride (InN), indium phosphide (InP) or combinations thereof.

4. The method for fabricating a semiconductor layer having a textured surface as claimed in claim 3, wherein the silicon comprises multi-crystalline silicon, single crystalline silicon or micro-crystalline silicon.

5. The method for fabricating a semiconductor layer having a textured surface as claimed in claim 1, wherein in step (b), the semiconductor layer is formed by a chemical vapor deposition method (CVD), physical vapor deposition method (PVD) or molecular beam epitaxy (MBE).

6. The method for fabricating a semiconductor layer having a textured surface as claimed in claim 1, before step (c), further comprising performing a doping step to the semiconductor layer.

7. The method for fabricating a semiconductor layer having a textured surface as claimed in claim 1, wherein the metal layer comprises gold, aluminum, silver or combinations thereof.

8. The method for fabricating a semiconductor layer having a textured surface as claimed in claim 1, wherein in step (c), the metal layer is formed by a coating method, printing method, electroplating method or physical vapor deposition method (PVD).

9. The method for fabricating a semiconductor layer having a textured surface as claimed in claim 1, wherein in step (d), the low temperature process is conducted at a temperature of about −250° C.--20° C.

10. The method for fabricating a semiconductor layer having a textured surface as claimed in claim 1, wherein in step (d), the low temperature process is conducted for about 1-10 minutes.

11. The method for fabricating a semiconductor layer having a textured surface as claimed in claim 1, wherein the semiconductor layer having a textured surface has a thickness of about 1-150 mm.

12. A method for fabricating a solar cell, comprising:
(a-2) providing a textured substrate;
(b-2) forming at least one silicon layer on the textured substrate;
(c-2) forming a metal layer on the silicon layer;
(d-2) conducting a low temperature process to the textured substrate, the silicon layer and the metal layer, wherein the silicon layer is separated from the textured substrate by the low temperature process to obtain the silicon layer having the metal layer and a textured surface;
(e-2) forming an anti-reflection layer on the silicon layer having a textured surface; and
(f-2) forming an electrode layer on the anti-reflection layer.

13. The method for fabricating a solar cell as claimed in claim 12, wherein in step (b-2), forming the silicon layer comprises:
forming a P-type silicon layer on the textured substrate; and
forming an N-type silicon layer on the P-type silicon layer.

14. The method for fabricating a solar cell as claimed in claim 12, wherein the silicon layer comprises multi-crystalline silicon, single crystalline silicon or micro-crystalline silicon.

15. The method for fabricating a solar cell as claimed in claim 12, wherein in step (d-2), the low temperature process is conducted at a temperature of about −250° C.—20° C.

16. The method for fabricating a solar cell as claimed in claim 12, wherein in step (d-2), the low temperature process is conducted for about 1-10 minutes.

17. The method for fabricating a solar cell as claimed in claim 12, in step (b-2), further comprising forming at least one silicon germanium alloy layer on the silicon layer.

\* \* \* \* \*